(12) United States Patent
Abadeer et al.

(10) Patent No.: US 7,790,543 B2
(45) Date of Patent: Sep. 7, 2010

(54) DEVICE STRUCTURES FOR A METAL-OXIDE-SEMICONDUCTOR FIELD EFFECT TRANSISTOR AND METHODS OF FABRICATING SUCH DEVICE STRUCTURES

(75) Inventors: Wagdi W. Abadeer, Jericho, VT (US); Kiran V. Chatty, Williston, VT (US); Robert J. Gauthier, Jr., Hinesburg, VT (US); Jed H. Rankin, Richmond, VT (US); Yun Shi, South Burlington, VT (US); William R. Tonti, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 264 days.

(21) Appl. No.: 11/972,941

(22) Filed: Jan. 11, 2008

(65) Prior Publication Data

US 2009/0179266 A1    Jul. 16, 2009

(51) Int. Cl.
*H01L 21/8238* (2006.01)
(52) U.S. Cl. .............................. 438/211; 257/E21.422
(58) Field of Classification Search .................. 438/165
See application file for complete search history.

(56) References Cited

U.S. PATENT DOCUMENTS

| | | | |
|---|---|---|---|
| 4,619,033 A | 10/1986 | Jastrzebski | |
| 5,416,041 A | 5/1995 | Schwalke | |
| 5,494,837 A | 2/1996 | Subramanian et al. | |
| 5,496,765 A | 3/1996 | Schwalke | |
| 5,637,898 A | 6/1997 | Baliga | |
| 5,689,127 A | 11/1997 | Chu et al. | |
| 5,700,712 A | 12/1997 | Schwalke | |
| 5,726,094 A | 3/1998 | Schwalke et al. | |
| 6,121,651 A | 9/2000 | Furukawa et al. | |
| 6,140,684 A | 10/2000 | Chan et al. | |
| 6,191,447 B1 | 2/2001 | Baliga | |
| 6,228,745 B1 | 5/2001 | Wheeler et al. | |
| 6,313,482 B1 | 11/2001 | Baliga | |

(Continued)

OTHER PUBLICATIONS

Ahn, et al., Comparison of Performance and Reliability Between MOSFET's with LPCVD Gate Oxide and Thermal Gate Oxide, IEEE Transactions on Electron Devices, vol. 38, No. 12, Dec. 1991 (2 pages).

(Continued)

*Primary Examiner*—Ha Tran T Nguyen
*Assistant Examiner*—Valerie Brown
(74) *Attorney, Agent, or Firm*—Wood, Herron & Evans, LLP

(57) ABSTRACT

Device structures for a metal-oxide-semiconductor field effect transistor (MOSFET) that is suitable for operation at relatively high voltages and methods of forming same. The MOSFET, which is formed using a semiconductor-on-insulator (SOI) substrate, includes a channel in a semiconductor body that is self-aligned with a gate electrode. The gate electrode and semiconductor body, which are both formed from the monocrystalline SOI layer of the SOI substrate, are separated by a gap that is filled by a gate dielectric layer. The gate dielectric layer may be composed of thermal oxide layers grown on adjacent sidewalls of the semiconductor body and gate electrode, in combination with an optional deposited dielectric material that fills the remaining gap between the thermal oxide layers.

9 Claims, 4 Drawing Sheets

U.S. PATENT DOCUMENTS

| | | |
|---|---|---|
| 6,323,082 B1 | 11/2001 | Furukawa et al. |
| 6,365,462 B2 | 4/2002 | Baliga |
| 6,483,156 B1 | 11/2002 | Adkisson et al. |
| 6,580,137 B2 | 6/2003 | Parke |
| 6,583,469 B1 | 6/2003 | Fried et al. |
| 6,624,459 B1 | 9/2003 | Dachtera et al. |
| 6,635,544 B2 | 10/2003 | Disney |
| 6,657,252 B2 | 12/2003 | Fried et al. |
| 6,750,105 B2 | 6/2004 | Disney |
| 6,764,889 B2 | 7/2004 | Baliga |
| 6,815,282 B2 | 11/2004 | Dachtera et al. |
| 6,949,768 B1 | 9/2005 | Anderson et al. |
| 6,960,507 B2 | 11/2005 | Kim et al. |
| 7,019,342 B2 | 3/2006 | Hackler, Sr. et al. |
| 7,052,958 B1 * | 5/2006 | Fried et al. ............ 438/257 |
| 7,078,296 B2 | 7/2006 | Chau et al. |
| 7,122,449 B2 | 10/2006 | Langdo et al. |
| 7,132,751 B2 | 11/2006 | Chang |
| 7,148,526 B1 | 12/2006 | An et al. |
| 7,217,603 B2 | 5/2007 | Currie et al. |
| 7,235,439 B2 | 6/2007 | Udrea et al. |
| 7,256,142 B2 | 8/2007 | Fitzgerald |
| 7,262,462 B2 | 8/2007 | Kim et al. |
| 7,462,905 B2 | 12/2008 | Imai et al. |
| 2003/0178670 A1 | 9/2003 | Fried et al. |
| 2003/0218198 A1 | 11/2003 | Dachtera et al. |
| 2005/0017289 A1 | 1/2005 | Kim et al. |
| 2005/0242368 A1 | 11/2005 | Udrea et al. |
| 2005/0242369 A1 | 11/2005 | Udrea et al. |
| 2006/0027869 A1 | 2/2006 | Kim et al. |
| 2006/0084212 A1 | 4/2006 | Anderson et al. |
| 2007/0109836 A1 | 5/2007 | Lung |
| 2008/0286978 A1 * | 11/2008 | Chen et al. ............ 438/713 |
| 2009/0179268 A1 | 7/2009 | Abou-Khalil et al. |
| 2009/0179269 A1 | 7/2009 | Hook et al. |

OTHER PUBLICATIONS

Ahn, et al., "Electrical Properties of MOSFET's with N2O-Nitrided LPCVD SiO2 Gate Dielectrics", IEEE Electron Device Letters, vol. 13, No. 9, Sep. 1992 (3 pages).

Lee, et al., "Statistical Modeling of Silicon Dioxide Reliability", IEEE Reliability Physics Symposium, 26th Annual Proceedings, 1998, pp. 131-138.

Lee, et al., "Modeling and Characteriziation of Gate Oxide Reliability", IEEE Transactions on Electron Devices, vol. 35, No. 12, Dec. 1998, pp. 2268-2278.

USPTO, Office Action issued in related U.S. Appl. No. 11/972,949 dated Aug. 21, 2009.

USPTO, Office Action issued in related U.S. Appl. No. 12/013,101 dated Feb. 2, 2010.

USPTO, Office Action issued in related U.S. Appl. No. 11/972,949 dated Mar. 5, 2010.

USPTO, Notice of Allowance issued in U.S. Appl. No. 12/013,101 dated Mar. 31, 2010.

Notice of Allowance issued in related U.S. Appl. No. 12/059,034 dated April 19, 2010.

\* cited by examiner

DEVICE STRUCTURES FOR A METAL-OXIDE-SEMICONDUCTOR FIELD EFFECT TRANSISTOR AND METHODS OF FABRICATING SUCH DEVICE STRUCTURES

CROSS-REFERENCE TO RELATED APPLICATIONS

This application is related to application Ser. No. 11/972,949, filed on even date herewith and entitled "Device and Design Structures for Memory Cells in a Non-Volatile Random Access Memory and Methods of Fabricating Such Device Structures".

FIELD OF THE INVENTION

The invention relates generally to semiconductor device fabrication and, in particular, to device structures for a metal oxide semiconductor field effect transistor (MOSFET) and methods for fabricating such device structures.

BACKGROUND OF THE INVENTION

Complementary metal-oxide-semiconductor (CMOS) technology is used in microprocessors, static random access memories, and other types of digital logic integrated circuits and analog integrated circuits. Generally, CMOS technology relies on complementary and symmetrical pairs of p-type and n-type metal oxide semiconductor field effect transistors (MOSFETs) to implement logic functions. Conventional planar device structures for a MOSFET include an active semiconductor layer, a source and a drain defined in the active semiconductor layer, a channel defined in the active semiconductor layer between the source and drain, and a gate electrode. The material constituting the gate electrode in such conventional planar device structures contains polycrystalline silicon (polysilicon) or a metal applied by an additive process that involves deposition of the material and patterning with a conventional lithography and etching process. When a control voltage exceeding a characteristic threshold voltage is applied to the gate electrode, an inversion or depletion layer is formed in the channel by the resultant electric field and carrier flow occurs in the depletion layer between the source and drain (i.e., the device output current).

Semiconductor-on-insulator (SOI) substrates may be advantageous for implementing MOSFETs in CMOS integrated circuits. In comparison with conventional bulk silicon MOSFETs, the use of an SOI substrate permits MOSFETs to operate at significantly higher speeds with improved electrical isolation and reduced electrical losses. High performance CMOS demands thin SOI layers, which permits the MOSFETs to operate in a fully-depleted state in which the depletion layer extends to the interface between the SOI layer and the buried oxide layer under typical control voltages.

In certain CMOS designs, low-voltage MOSFETs and high-voltage MOSFETs are integrated into a single integrated circuit. The former device type is used for logic functions. The latter device type is used for analog functions and for any special circuits requiring relatively high operating voltages and relatively low gate tunneling currents. This single chip implementation may be accomplished by reliance on thin gate oxide layers (e.g., 1 nm to 1.5 nm) for low-voltage MOSFETs and thick gate oxide layers (e.g., 2.5 nm to 4 nm) for high-voltage MOSFETs. Thick gate oxides may be difficult to perfect in high-performance CMOS because of the relatively small thickness of the SOI layer. Moreover, integration of both low-voltage and high-voltage MOSFET devices in a single integrated circuit in conventional CMOS fabrication schemes may require a relatively large number of fabrication steps and a large number of different masks for concurrent fabrication.

Consequently, improved device structures and fabrication methods are needed for high voltage MOSFETs that overcome these and other deficiencies of conventional device structures for high-voltage MOSFETs and conventional fabrication methods.

SUMMARY OF THE INVENTION

In one embodiment, a device structure is provided which is carried on an insulating layer. The device structure includes a semiconductor body with a source, a drain, and a channel disposed between the source and the drain. The channel has a first sidewall that extends toward the insulating layer. The device structure further includes a gate electrode with a second sidewall that intersects the insulating layer. A gate dielectric layer, which intersects the insulating layer, is disposed between the semiconductor body and the gate electrode. The gate dielectric layer is composed of a dielectric material that electrically isolates the gate electrode from the channel.

In another embodiment, a method is provided for fabricating a device structure on an insulating layer. The method includes forming a first semiconductor body having a first sidewall that extends toward the insulating layer and forming a second semiconductor body having a second sidewall that extends toward the insulating layer. The first semiconductor body is doped to form a source and a drain. A gate dielectric layer is formed that extending to the insulating layer at a location between the first sidewall of the first semiconductor body and the second sidewall of the second semiconductor body. The method further includes and partially removing the second semiconductor body to define a gate electrode configured to control carrier flow in a channel between the source and the drain of the first semiconductor body.

DETAILED DESCRIPTION

Figure 1A:
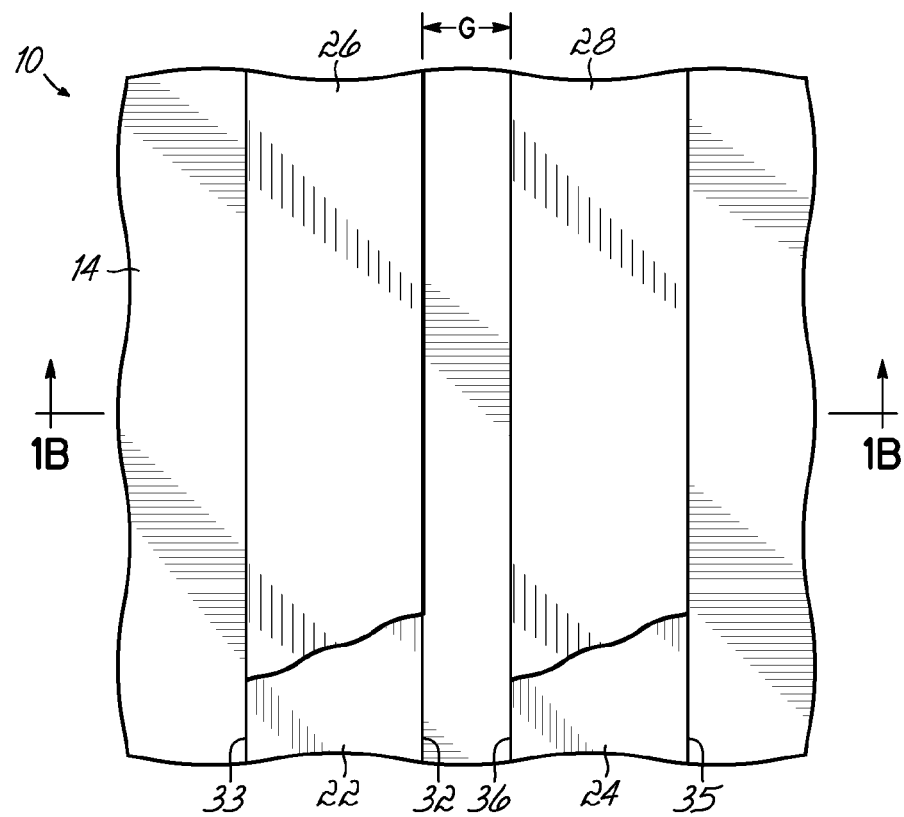
FIG. 1A is a diagrammatic top plan view of a device structure built on a portion of a semiconductor-on-insulator substrate at an initial fabrication stage of a processing method in accordance with an embodiment of the invention.
Figure 1B:
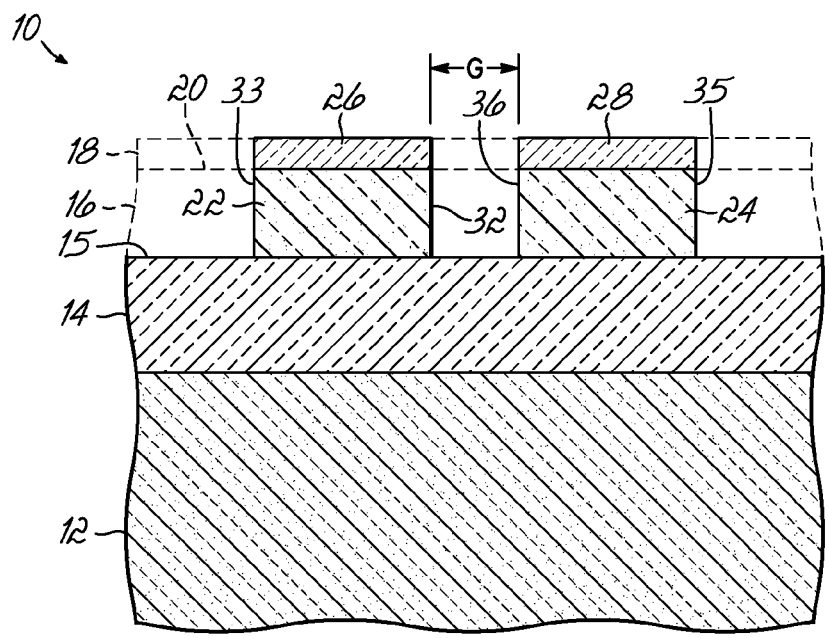
FIG. 1B is a diagrammatic cross-sectional view taken generally along line 1B-1B in FIG. 1A.

With reference to FIGS. 1A,B and in accordance with an embodiment of the invention, a semiconductor-on-insulator (SOI) substrate 10 includes a handle wafer 12, a buried insulating layer 14 formed of an insulating material such as silicon dioxide (e.g., $SiO_2$), and an active semiconductor or SOI layer 16 separated from the handle wafer 12 by the intervening buried insulating layer 14. The SOI layer 16 is constituted by a single crystal or monocrystalline semiconductor material, such as silicon or a material that primarily contains silicon. The monocrystalline semiconductor material of the SOI layer 16 may contain a definite defect concentration and still be considered single crystal. The handle wafer 12 may also be constituted by a single crystal or monocrystalline semiconductor material, such as silicon, or another type of material. The SOI layer 16, which is considerably thinner than the handle wafer 12 and is in direct contact with a top surface 15 of the buried insulating layer 14 to define an interface, is electrically isolated from the handle wafer 12 by the buried insulating layer 14. The SOI substrate 10 may be fabricated by any suitable conventional technique, such as a wafer bonding technique or a separation by implantation of oxygen (SIMOX) technique, which are techniques familiar to a person having ordinary skill in the art.

A pad layer 18 is disposed on a top surface 20 of the SOI layer 16 across the SOI substrate 10. The material forming pad layer 18 is selected to operate as a hardmask that etches selectively to the semiconductor material constituting the SOI layer 16. The hardness and wear resistance of the material constituting pad layer 18 are also adequate to function as a polish stop layer and reactive ion etch mask during subsequent fabrication stages. The pad layer 18 may be $SiO_2$ deposited by a thermal CVD process or $SiO_2$ grown by oxidizing a surface thickness of the SOI layer 16. Alternatively, the pad layer 18 may be composed of a different material, such as silicon-oxynitride ($SiO_xN_y$).

A plurality of juxtaposed bodies, of which two representative bodies 22, 24 are visible in FIGS. 1A,B, are defined from the material of the SOI layer 16 by a conventional lithography and anisotropic etching process. The lithography process applies a resist (not shown) on pad layer 18, exposes the resist to a pattern of radiation, and develops the transferred pattern in the exposed resist. The pattern is transferred to the SOI layer 16 by a series of anisotropic dry etches, such as reactive-ion etching (RIE) or a plasma etching process, that patterns the pad layer 18 using the patterned resist as an etch mask and then patterns the SOI layer 16 using the patterned pad layer 18 as an etch mask. The etching process removes the material of the SOI layer 16 selective (i.e., at a significantly higher etch rate) to the material of the pad layer 18 and resist layer and stops on the buried insulating layer 14. After etching is concluded, residual resist is stripped by, for example, plasma ashing or chemical stripping.

The bodies 22, 24 represent adjacent, parallel first and second lines of the semiconductor material originating from the SOI layer 16 and are in direct contact with the top surface 15 of the buried insulating layer 14. The gap, G, between the bodies 22, 24 is determined by the lithography process or by other sub-lithographic definition processes, such as pitch doubling sidewall image transfer. Residual dielectric caps 26, 28, which represent residual portions of the material of pad layer 18 that remain intact after etching with the patterned resist in place, cover the respective bodies 22, 24 in a stacked arrangement. Dielectric caps 26, 28 have approximately the same footprint, in terms of width and length, as the bodies 22, 24.

Sidewalls 32, 33 of body 22 extend from top surface 20 toward the buried insulating layer 14 and intersect the buried insulating layer 14. Similarly, body 24 includes sidewalls 35, 36 that extend from top surface 20 toward the buried insulating layer 14 and intersect the buried insulating layer 14. Sidewall 32 of body 22 is contained in a plane that is aligned substantially parallel to, but spaced from, a plane containing sidewall 36 of body 24. Sidewalls 32, 36 are separated by the gap, G.

Figure 2A:
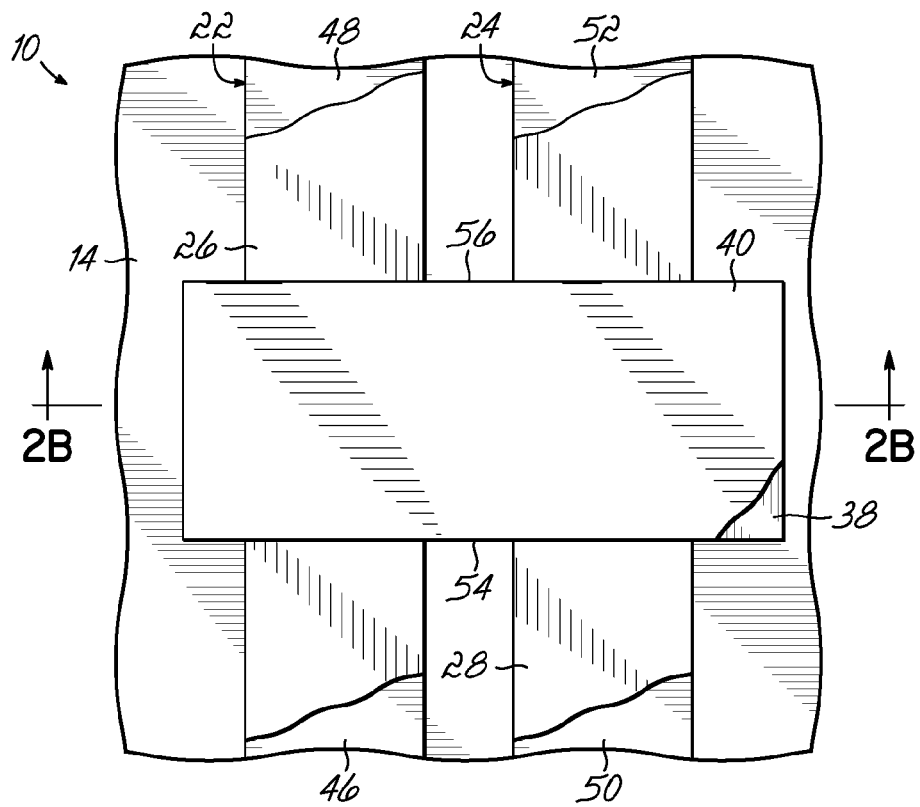
FIG. 2A is a diagrammatic top plan view of the device structure of FIG. 1A at a subsequent fabrication stage.
Figure 2B:
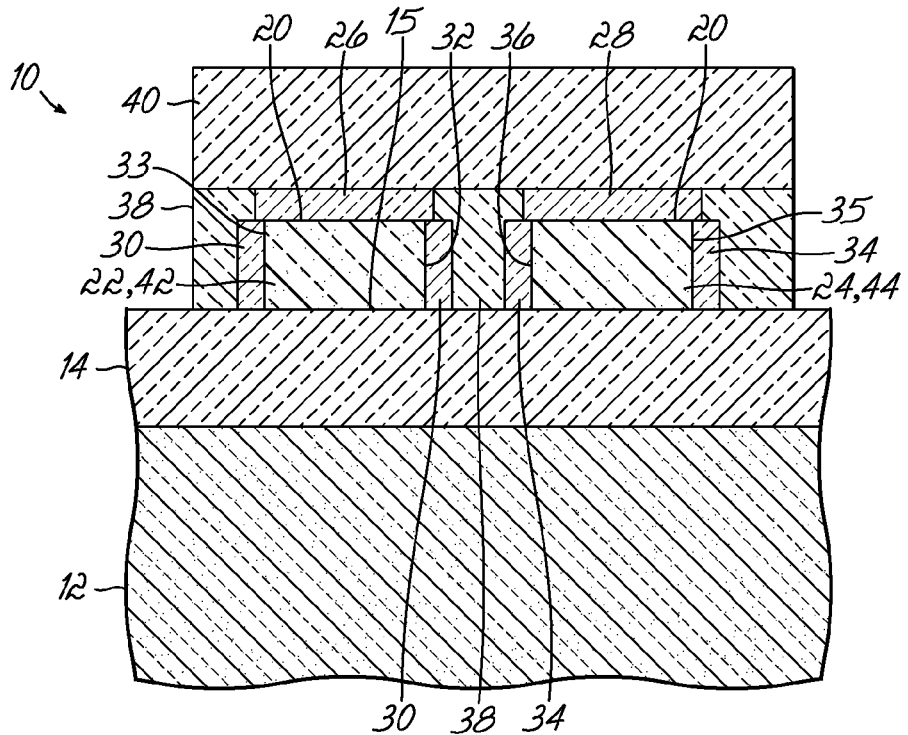
FIG. 2B is a diagrammatic cross-sectional view taken generally along line 2B-2B in FIG. 2A.

With reference to FIGS. 2A,B in which like reference numerals refer to like features in FIGS. 1A,B and at a subsequent fabrication stage, a dielectric layer 30 is then formed on opposite sidewalls 32, 33 of body 22 and a dielectric layer 34 is formed on the opposite sidewalls 35, 36 of body 24. In one embodiment, the dielectric material constituting dielectric layers 30, 34 may be $SiO_2$ grown by a thermal oxidation process. The oxidation process entails exposing the bodies 22, 24 to a dry or wet oxygen-laden, heated ambient in, for example, an oxidation furnace or a rapid thermal anneal chamber. Oxidation conditions are selected to provide an appropriate thickness for the dielectric layers 30, 34, which at least partially fill the gap, G.

A blanket layer 38 of a dielectric material is deposited to fill the open spaces about the bodies 22, 24 and, in particular, a portion of the dielectric layer 38 fills the remainder of the narrowed gap, G, between the sidewalls 32, 36 that is unfilled by dielectric layers 30, 34. The dielectric layer 38 may be composed of stoichiometric or non-stoichiometric $SiO_2$ deposited by a chemical vapor deposition (CVD) process, or other dielectrics, including silicon oxy-nitride, hafnium oxide, or any other material with predominately dielectric properties. The dielectric layer 38 is planarized by a conventional planarization process, such as a chemical mechanical polishing (CMP) process, that removes the excess overburden of the blanket dielectric layer 38 and stops on the dielectric caps 26, 28. Typically if the dielectric material is $SiO_2$, the quality of $SiO_2$ in the dielectric layers 30, 34 is superior to the quality of the $SiO_2$ in dielectric layer 38 because of the different formation processes.

A person having ordinary skill in the art will appreciate that the portion of the dielectric layer 38 in the gap, G, between the sidewalls 32, 36 is optional and that the dielectric layers 30, 34 may have a thickness sufficient to completely fill and close the gap, G, between the sidewalls 32, 36.

A photoresist mask 40 is then formed from a resist layer that is patterned by a conventional lithography and anisotropic etching process. Opposite side edges of the photoresist mask 40 have a roughly orthogonal alignment relative to the bodies 22, 24. An anisotropic etching process is applied to remove the material of the dielectric layers 30, 34, 38 selective to the semiconductor material of the bodies 22, 24. Dielectric material in the dielectric caps 26, 28 and portions of the dielectric layers 30, 34, 38 located beneath the photoresist mask 40 are preserved during the etching process because of the masking. The etching process operates to remove the dielectric caps 26, 28 and dielectric layers 30, 34, 38 outside of the protective footprint of the photoresist mask 40 so that the unmasked semiconductor material of the bodies 22, 24 is exposed.

Figure 4A:
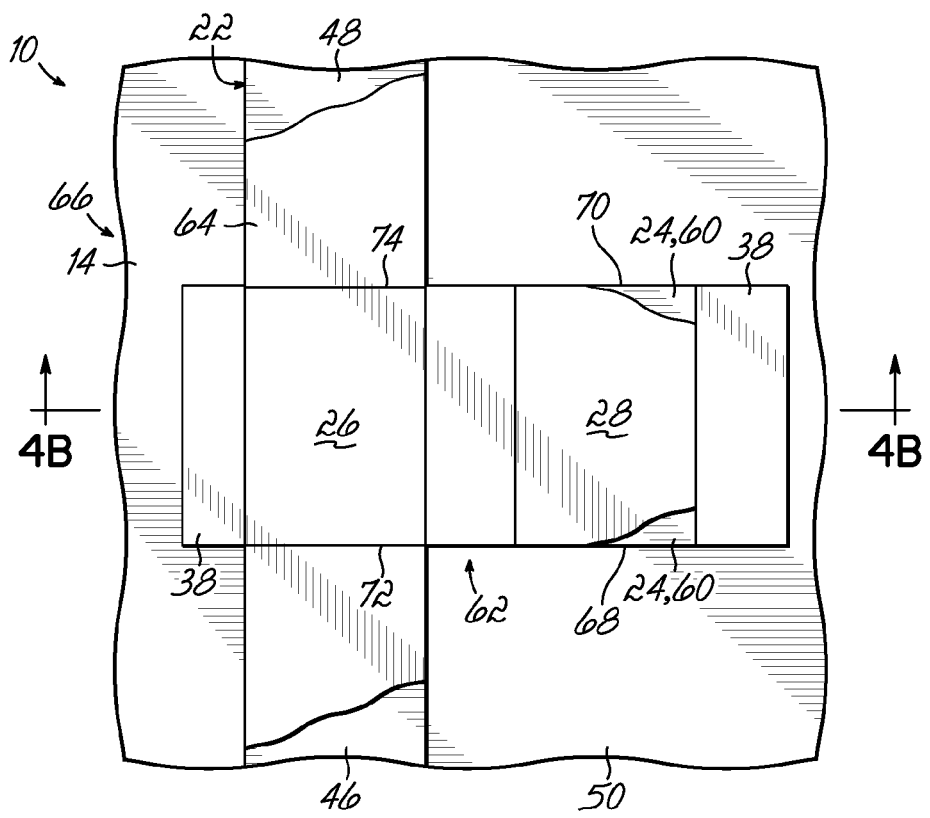
FIG. 4A is a diagrammatic top plan view of the device structure of FIG. 3A at a subsequent fabrication stage.
Figure 4B:
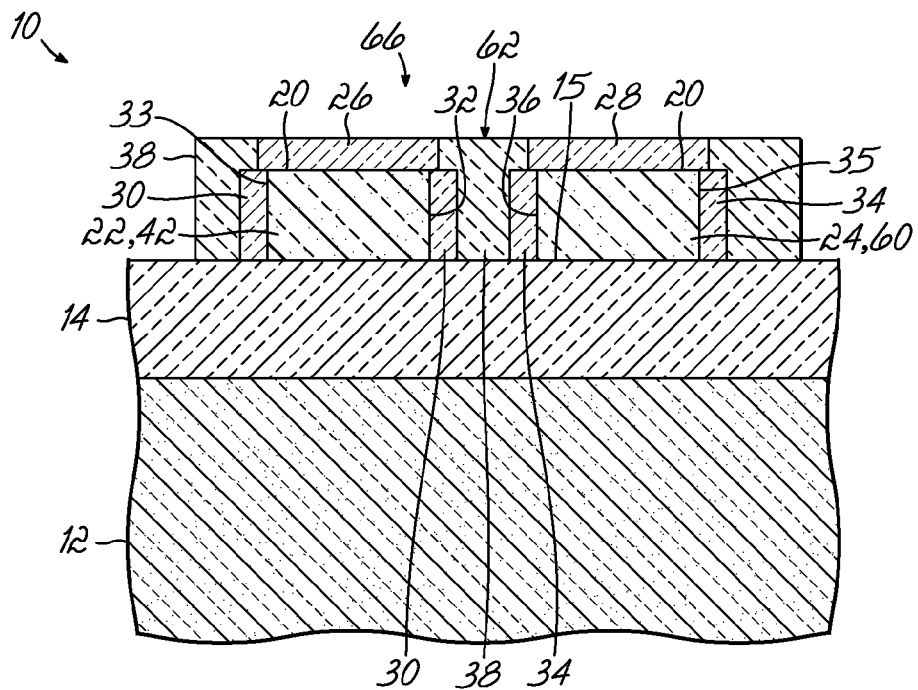
FIG. 4B is a diagrammatic cross-sectional view taken generally along line 4B-4B in FIG. 4A.

After etching, the photoresist mask 40 intersects body 22 along a central channel 42 and covers a portion 44 of body 24. Opposite end regions 46, 48 of body 22, which flank the channel 42, and opposite end regions 50, 52 of body 24 project or protrude outwardly from opposite sidewalls 54, 56 of the photoresist mask 40. The end regions 46, 48 of body 22 are implanted with a suitable n-type or p-type dopant at a dose effective to define a source and a drain, respectively, for the device structure 66 (FIGS. 4A,B). The photoresist mask 40 blocks the dopant from entering the channel 42 of body 22 and the covered portion 44 of body 24. End regions 50, 52 of body 24, which are unmasked and receive dopant, are excised in a subsequent fabrication stage. Shallow source/drain extensions and halos (not shown) may be introduced into body 22 beneath the opposing sidewalls 54, 56 of the photoresist mask 40 by angled ion implantations.

Figure 3A:
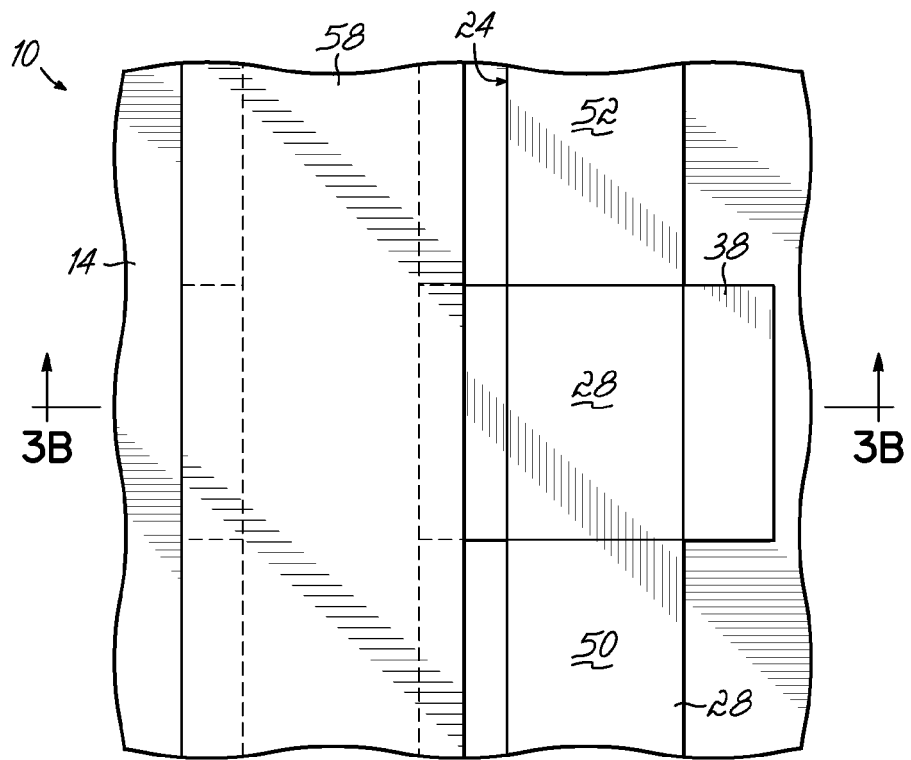
FIG. 3A is a diagrammatic top plan view of the device structure of FIG. 2A at a subsequent fabrication stage.

With reference to FIGS. 3A,B in which like reference numerals refer to like features in FIGS. 2A,B and at a subsequent fabrication stage, the photoresist mask 40 (FIGS. 2A,B) is removed by, for example, plasma ashing or chemical stripping. Another photoresist mask 58 is then formed from a resist layer that is patterned by a conventional lithography and anisotropic etching process. The photoresist mask 58 has a parallel alignment with body 22 and extends laterally beyond the opposite sidewalls 32, 33 of body 22. The dielectric cap 28 and dielectric layers 34, 38 operate as a hard mask for the covered portion 44 of body 24.

Figure 3B:
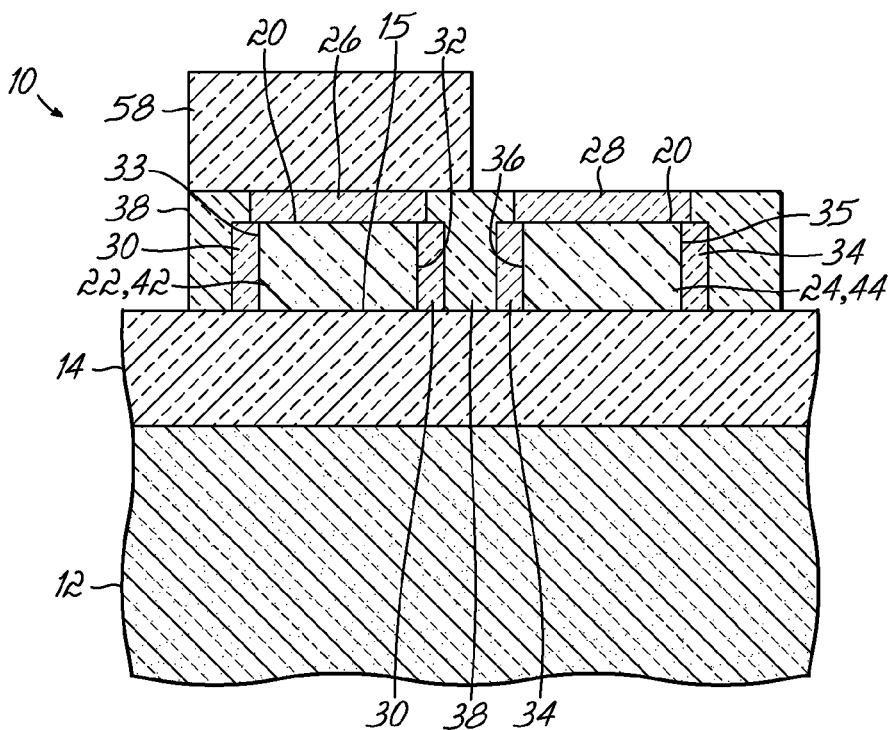
FIG. 3B is a diagrammatic cross-sectional view taken generally along line 3B-3B in FIG. 3A.

With reference to FIGS. 4A,B in which like reference numerals refer to like features in FIGS. 3A,B and at a subsequent fabrication stage, the unprotected semiconductor material in the end regions 50, 52 of body 24 is removed by an anisotropic etching process selective to the dielectric materials constituting dielectric cap 28 and dielectric layers 34, 38. The covered portion 44 (FIG. 3B) of the semiconductor material of body 24 is preserved and serves as a gate electrode 60 for a device structure, which is generally indicated by reference numeral 66. The etching process, which stops on the buried insulating layer 14, truncates the body 24 so that gate electrode 60 has opposite end walls 68, 70 that extend to the buried insulating layer 14. The photoresist mask 58, which protects the opposite end regions 46, 48 of body 22 during the etching process, is removed by, for example, plasma ashing or chemical stripping.

The hard mask supplied by the dielectric cap 28 and the presence of the dielectric layers 34, 38, as well as the presence of the photoresist mask 58, operates to self-align the gate electrode 60 with the channel 42 of body 22, as well as to self-align the gate electrode 60 with the source and drain in the doped opposite end regions 46, 48 of body 24. Specifically, end wall 68 of the gate electrode 60 is generally aligned (i.e., coplanar) with the planar interfaces between the channel 42 in body 22 and the doped region in the end region 46 of body 22 representing the source for the device structure 66. Similarly, end wall 70 of the gate electrode 60 is generally aligned (i.e., coplanar) with the planar interfaces between the channel 42 in body 22 and the doped region in the end region 48 of body 22 representing the drain for the device structure 66. These planar interfaces generally underlie the opposite side edges 72, 74 of the dielectric cap 26 and extend through the body 22 from these positions underlying the side edges 72, 74 to the buried insulating layer 14.

After etching, the gate electrode 60 represents the residual portion of the monocrystalline semiconductor material of body 24. The gate electrode 60 is physically separated from the channel 42 of body 22 by the thickness of the dielectric layer 30 on sidewall 32 of body 22, the thickness of the dielectric layer 34 on sidewall 36 of body 24, and the thickness of the dielectric layer 38 between dielectric layer 30 and dielectric layer 34, which collectively define a gate dielectric layer generally indicated by reference numeral 62. The gate dielectric layer 62 physically separates the gate electrode 60 from the channel 42 of body 22 and electrically isolates the gate electrode 60 from the channel 42. The gate electrode 60 and the body 22 have nominally equal thicknesses measured from their respective top surfaces to the buried insulating layer 14 and are composed of substantially identical monocrystalline silicon originating from the SOI layer 16.

A silicide layer 64 is formed on the exposed end regions 46, 48 of body 22 that are not covered by dielectric cap 26 and dielectric layers 30, 38 and, in particular, is formed on the top surfaces of end regions 46, 48. Silicidation processes are familiar to a person having ordinary skill in the art. In an exemplary silicidation process, the silicide layer 64 may be formed by depositing a layer of suitable metal, such as nickel, cobalt, tungsten, titanium, etc., and then annealing with, for example, a rapid thermal annealing process, to react the metal with the silicon-containing semiconductor material (e.g., silicon) of the end regions 46, 48 of body 22. The silicidation process may be conducted in an inert gas atmosphere or in a nitrogen-rich gas atmosphere, and at a temperature of about 350° C. to about 600° C. contingent upon the type of silicide being considered for silicide layer 64. Following the high temperature anneal, unreacted metal remains on areas of the device structure 66 where the deposited metal is not in contact with a silicon-containing material. The unreacted metal is selectively removed with an isotropic wet chemical etch process. The process self aligns the silicide to the exposed silicon-containing regions because of the selective reaction between the metal and silicon-containing semiconductor material.

The device structure 66 includes the source and drain defined in the end regions 46, 48 of body 22, the gate electrode 60 defined from the adjacent body 24, and the gate dielectric layer 62. Because of the manner in which the gate dielectric layer 62 is fabricated, its thickness may range from about 10 nm to about 200 nm or even as thick as 300 nm. The thickness of the gate dielectric layer 62, which is measured between the sidewalls 32, 36, is considerably thicker than gate dielectric layers found in conventional high voltage MOSFETs. The body thickness of the body 22 and the thickness of the gate dielectric layer 62 can be independently adjusted during fabrication.

During the fabrication process, the device structure 66 is replicated across at least a portion of the surface area of the SOI layer 16 of the SOI substrate 10. Standard processing follows, which includes formation of metallic contacts, metallization for the M1 level interconnect wiring, and interlayer dielectric layers, conductive vias, and metallization for upper level (M2-level, M3-level, etc.) interconnect wiring. Metallization in the contact level of the interconnect wiring establishes electrical contacts with the gate electrode 60 and independent electrical contacts mediated by the silicide layer 64 with the source and drain defined in the end regions 46, 48 of body 22. Low voltage CMOS field effect transistors (not shown), which are characterized by a significantly thinner gate dielectric (e.g., gate oxide) thicknesses, may be fabricated on other surface areas of the SOI substrate 10 and entirely independent of the fabrication process forming device structures like device structure 66, or some of the process steps may be shared with steps used to form the conventional devices.

Device structure 66 may be used as a thick oxide MOSFET in a sub-micron CMOS process that can be used for high-voltage (i.e., greater than about 2.5 Volts) applications. The device structure 66 may be used as an RF power switch in which the device is rated at 5 volts, 20 volts, or even larger voltages. Because of the relatively thick, and lithographically variable dielectric layer 62, device structure 66 may be used in a sub-micron CMOS process as a receiver in a high-voltage input/output application. The device structure 66 may be used to create an electrostatic discharge (ESD) robust pass-gate transistor that is connected to an input/output pad.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The term "vertical" refers to a direction perpendicular to the horizontal, as just defined. Terms, such as "on", "above", "below", "side" (as in "sidewall"), "upper", "lower", "over", "beneath", and "under", are defined with respect to the horizontal plane. It is understood that various other frames of reference may be employed for describing the invention without departing from the spirit and scope of the invention. It is also understood that features of the invention are not necessarily shown to scale in the drawings. Furthermore, to the extent that the terms "includes", "having", "has", "with", or variants thereof are used in either the detailed description or the claims, such terms are intended to be inclusive in a manner similar to the term "comprising."

The fabrication of the semiconductor structure herein has been described by a specific order of fabrication stages and steps. However, it is understood that the order may differ from that described. For example, the order of two or more fabrication steps may be swapped relative to the order shown. Moreover, two or more fabrication steps may be conducted either concurrently or with partial concurrence. In addition, various fabrication steps may be omitted and other fabrication steps may be added. It is understood that all such variations are within the scope of the present invention. It is also understood that features of the present invention are not necessarily shown to scale in the drawings.

While the invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. Thus, the invention in its broader aspects is therefore not limited to the specific details, representative apparatus and method, and illustrative example shown and described. Accordingly, departures may be made from such details without departing from the spirit or scope of applicants' general inventive concept.

What is claimed is:

1. A method of fabricating a device structure on an insulating layer, the method comprising:
    forming a first semiconductor body with a first sidewall that extends toward the insulating layer;
    forming a second semiconductor body having a second sidewall that extends toward the insulating layer;
    doping the first semiconductor body to form a source and a drain;
    forming a gate dielectric layer extending to the insulating layer at a location between the first sidewall of the first semiconductor body and the second sidewall of the second semiconductor body; and
    partially removing the second semiconductor body to define a gate electrode configured to control carrier flow in a channel between the source and the drain of the first semiconductor body,
    wherein the gate dielectric layer is formed by concurrently growing a first silicon dioxide layer on the first sidewall of the first semiconductor body and a second silicon dioxide on the second sidewall of the second semiconductor body with a thermal oxidation process.

2. The method of claim 1 wherein the first and second silicon dioxide layers are separated by a gap, and forming the gate dielectric layer further comprises:
    depositing a dielectric fill layer to fill between the gap between the first and second silicon dioxide layers.

3. The method of claim 2 wherein forming the gate dielectric layer further comprises:
    masking the first and second silicon dioxide layers, the dielectric fill layer, and the channel with a photoresist mask orthogonally spanning the first and second semiconductor bodies; and
    removing unmasked portions of the first and second silicon dioxide layers and the dielectric fill layer with an etching process.

4. The method of claim 3 further comprising:
    using portions of the first and second silicon dioxide layers and the dielectric fill layer masked by the photoresist mask as an etch mask for partially removing unmasked portions of the second semiconductor body with another etching process.

5. The method of claim 1 wherein the first and second semiconductor bodies contain monocrystalline silicon, the first semiconductor body is formed concurrently with the semiconductor second body, and forming the first semiconductor body and the second semiconductor body further comprises:
    forming a hard mask on a layer of the monocrystalline silicon in contact with the insulating layer;
    patterning the hard mask with masked regions that are complimentary to the first and second semiconductor bodies; and
    concurrently removing unmasked portions of the layer of the monocrystalline silicon to form the first and second semiconductor bodies.

6. A method of fabricating a device structure on an insulating layer, the method comprising:
    forming a first semiconductor body with a first sidewall that extends toward the insulating layer;
    forming a second semiconductor body having a second sidewall that extends toward the insulating layer;
    doping the first semiconductor body to form a source and a drain;
    forming a gate dielectric layer extending to the insulating layer at a location between the first sidewall of the first semiconductor body and the second sidewall of the second semiconductor body; and
    partially removing the second semiconductor body to define a gate electrode configured to control carrier flow in a channel between the source and the drain of the first semiconductor body; and
    non-concurrently forming another device structure on the insulating layer that includes a gate dielectric layer thinner than the gate dielectric layer of the device structure.

7. The method of claim 1 wherein partially removing the second semiconductor body further comprises:
    partially masking the second semiconductor body with a dielectric cap; and
    removing unmasked portions of the second semiconductor body with an etching process that removes the unmasked portions selective to the dielectric cap to define the gate electrode.

8. The method of claim 7 further comprising:
    forming a photoresist mask on the first semiconductor body to protect the first semiconductor body against the etching process when the unmasked portions of the second semiconductor body are removed.

9. The method of claim 1 wherein the first dielectric layer is formed between the first semiconductor body and the second semiconductor body after the first and second semiconductor bodies are formed.

* * * * *